United States Patent
Sanchez et al.

(10) Patent No.: US 10,199,302 B1
(45) Date of Patent: Feb. 5, 2019

(54) MOLDED AIR CAVITY PACKAGES AND METHODS FOR THE PRODUCTION THEREOF

(71) Applicant: NXP USA, INC., Austin, TX (US)

(72) Inventors: Audel Sanchez, Tempe, AZ (US); Lakshminarayan Viswanathan, Phoenix, AZ (US); Fernando A. Santos, Chandler, AZ (US); Jaynal A. Molla, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 33 days.

(21) Appl. No.: 15/670,429

(22) Filed: Aug. 7, 2017

(51) Int. Cl.
*H01L 23/495* (2006.01)
*H01L 23/047* (2006.01)
*H01L 21/48* (2006.01)
*H01L 23/10* (2006.01)
*H01L 23/31* (2006.01)
*H01L 23/00* (2006.01)
(Continued)

(52) U.S. Cl.
CPC ........ *H01L 23/315* (2013.01); *H01L 21/4817* (2013.01); *H01L 21/4825* (2013.01); *H01L 21/4839* (2013.01); *H01L 21/4842* (2013.01); *H01L 21/4882* (2013.01); *H01L 21/56* (2013.01); *H01L 23/047* (2013.01); *H01L 23/10* (2013.01); *H01L 23/4952* (2013.01); *H01L 23/49513* (2013.01); *H01L 23/49558* (2013.01); *H01L 23/49565* (2013.01); *H01L 23/49568* (2013.01); *H01L 24/27* (2013.01); *H01L 24/29* (2013.01); *H01L 23/66* (2013.01); *H01L 2224/27505* (2013.01); *H01L 2224/29139* (2013.01); *H01L 2224/29144* (2013.01); *H01L 2224/29147* (2013.01)

(58) Field of Classification Search
CPC ............. H01L 21/4817; H01L 21/4839; H01L 23/00–23/66
See application file for complete search history.

(56) References Cited

U.S. PATENT DOCUMENTS 5,019,892 A 5/1991 Grabbe
5,122,862 A 6/1992 Kajihara et al.
(Continued)

OTHER PUBLICATIONS

Notice of Allowance dated Sep. 26, 2018 for U.S. Appl. No. 15/670,703 7 pages.

*Primary Examiner* — Daniel P Shook

(57) ABSTRACT

Molded air cavity packages and methods for producing molded air cavity packages are disclosed. In one embodiment, the molded air cavity package includes a base flange, retention posts integrally formed with the base flange and extending from the flange frontside in a direction opposite the flange backside, and retention tabs having openings through which the retention posts are received. A molded package body is bonded to the base flange and envelopes, at least in substantial part, the retention posts and the retention tabs. The molded air cavity package further includes package leads extending from the molded package body. In certain implementations, the package leads and the retention tabs comprise singulated portions of a leadframe. Additionally or alternatively, the retention posts may be staked or otherwise physically deformed in a manner preventing disengagement of the retention posts from the retention tabs along a centerline of the molded air cavity package.

13 Claims, 8 Drawing Sheets

(51) Int. Cl.
*H01L 21/56* (2006.01)
*H01L 23/66* (2006.01)

(56) References Cited

U.S. PATENT DOCUMENTS

| | | |
|---|---|---|
| 5,185,653 A | 2/1993 | Switky et al. |
| 5,801,074 A | 9/1998 | Kim et al. |
| 6,011,303 A | 1/2000 | Tanaka et al. |
| 6,349,032 B1 * | 2/2002 | Chan .................. H01L 23/4093 257/718 |
| 6,421,244 B1 | 7/2002 | Shinohara et al. |
| 6,703,692 B1 | 3/2004 | Pruitt |
| 6,774,465 B2 | 8/2004 | Lee et al. |
| 6,867,367 B2 | 3/2005 | Zimmerman |
| 6,983,537 B2 | 1/2006 | Park |
| 7,224,047 B2 | 5/2007 | Carberry et al. |
| 7,429,790 B2 | 9/2008 | Condie et al. |
| 7,445,967 B2 | 11/2008 | Abdo et al. |
| 7,923,739 B2 | 4/2011 | Hussell |
| 8,698,291 B2 | 4/2014 | Sanchez et al. |
| 8,742,555 B2 | 6/2014 | Wen et al. |
| 2003/0153128 A1 | 8/2003 | Ito |
| 2004/0011699 A1 | 1/2004 | Park |
| 2004/0262720 A1 | 12/2004 | Satou et al. |
| 2005/0016750 A1 | 1/2005 | Zimmerman |
| 2009/0051018 A1 | 2/2009 | Moline |
| 2012/0164792 A1 | 6/2012 | Rotay |
| 2014/0022020 A1 | 1/2014 | Aaen et al. |
| 2017/0062295 A1 | 3/2017 | Martin |

\* cited by examiner

MOLDED AIR CAVITY PACKAGES AND METHODS FOR THE PRODUCTION THEREOF

TECHNICAL FIELD

Embodiments of the present invention relate generally to microelectronic packaging and, more particularly, to molded air cavity packages and methods for the production thereof.

ABBREVIATIONS

The following abbreviations appear throughout this document:
ACM—Molded Air Cavity or Air Cavity Molded;
Ag—Silver;
Au—Gold;
CTE—Coefficient of Thermal Expansion;
Cu—Copper;
IC—Integrated Circuit;
MEMS—Microelectromechanical Systems;
Mo—molybdenum;
PFPE—perfluoropolyether;
RF—Radio Frequency;
SiP—System-in-Package;
Wt %—Weight percent; and
° C.—degrees Celsius.

BACKGROUND

Air cavity packages are usefully employed to house semiconductor die and other microelectronic devices, particularly those supporting RF functionalities. Air cavity packages are fabricated in a variety of different manners, with different manufacturing approaches associated with varying benefits and drawbacks. In one common approach for manufacturing leaded air cavity packages, a discretely-fabricated piece commonly referred to as a "window frame" is bonded between the package leads and a base flange. The window frame is produced from a dielectric material, such as a ceramic, to provide electrical insulation between the base flange and the package leads. The window frame may have a rectangular planform geometry and a central opening, which defines an outer perimeter of the air cavity when the air cavity package is assembled. Prior to attachment of a lid or cover piece, one or more microelectronic devices are positioned within the air cavity and bonded to the base flange, which may serve as a heat sink and, perhaps, as an electrically-conductive terminal of the package. Afterwards, the microelectronic devices are electrically interconnected with the package leads by, for example, wirebonding. The cover piece is then bonded over the window frame to sealingly enclose the air cavity and complete fabrication of the air cavity package.

In another air cavity package manufacturing approach, a molding process is carried-out to form a molded package body over and around selected regions of the base flange and package leads in place of the above-described window frame. Along with an exposed upper surface of the base flange, the molded package body defines an open air cavity in which one or more microelectronic devices are subsequently installed. After installation of the microelectronic devices and interconnection with the package leads, a cover piece is positioned in the air cavity and bonded to the molded package body to complete the package fabrication process. Utilizing such a mold-based manufacturing approach, so-called "molded air cavity packages" can be fabricated in a manner similar to the above-described, window frame-containing air cavity packages, but with greater process efficiencies and at lower manufacturing costs. These advantages notwithstanding, certain limitations continue to hamper processes for manufacturing molded air cavity packages, as conventionally performed. Such limitations may generally relate to difficulties encountered in maintaining precise alignment between package components prior to and/or through the molding process. Additionally, in the context of conventional molded air cavity package fabrication processes, it may be difficult to ensure the formation of reliable, high integrity seals between bonded components, as may be critical to preserve the sealed environment of the air cavity over the package lifespan in certain applications.

BRIEF DESCRIPTION OF THE DRAWINGS

At least one example of the present invention will hereinafter be described in conjunction with the following figures, wherein like numerals denote like elements, and.

Figure 1:
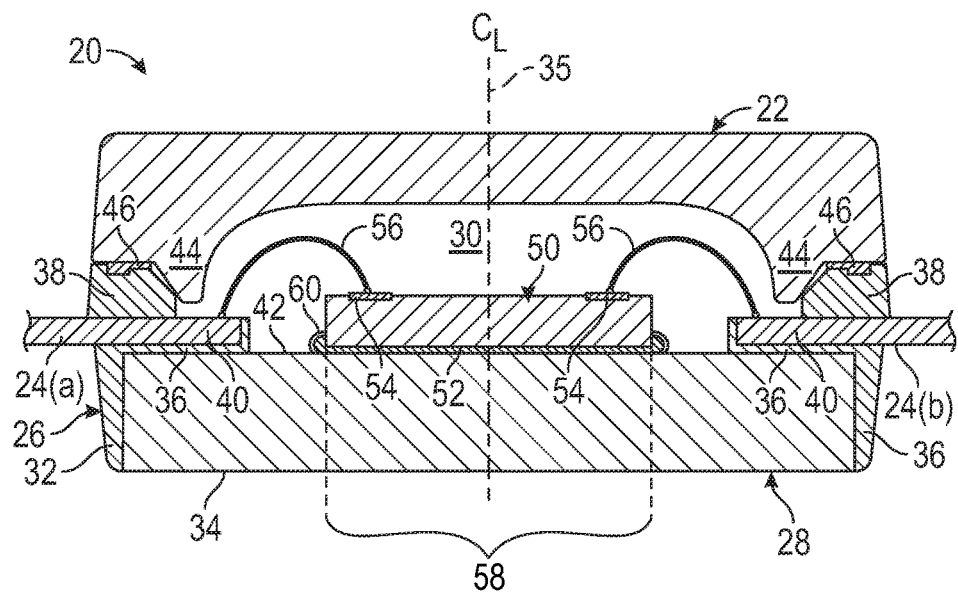
FIGS. 1 and 2 are cross-sectional views of an ACM package, which includes multiple unique structural features and which is illustrated in accordance with an exemplary embodiment of the present disclosure.

For simplicity and clarity of illustration, descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. The term "exemplary," as appearing throughout this document, is synonymous with the term "example" and is utilized repeatedly below to emphasize that the following description provides only multiple non-limiting examples of the invention and should not be construed to restrict the scope of the invention, as set-out in the Claims, in any respect.

The term "air cavity package," as appearing throughout this document, refers to a microelectronic package including a sealed cavity that is at least partially filled with a gas, regardless of the internal pressure within the cavity. The "air cavity" of the air cavity package may be enclosed in an open air environment and, thus, may contain air at approximately 1 atmosphere pressure with slight variations depending upon elevation and processing temperatures during package manufacture. In other implementations, the "air cavity" of the air cavity package may be enclosed in a partially evacuated chamber or a chamber containing an inert gas, such as argon, during manufacture and, thus, may not contain pure air in all instances. The term "air cavity," then, should be understood as referring to a gas-containing cavity, which may or may not be partially evacuated and which is sealed from the ambient environment. Additionally, the seal formed between the air cavity and the ambient environment may not be hermetic, as strictly defined, but rather may be a low leakage seal having a gross leakage rate falling within acceptable parameters. Thus, as appearing herein, a cavity is considered "sealed" when little to no leakage (bubbles) are observed from the cavity's exterior when the cavity is filled with air or another gas and the air cavity package is fully immersed in a liquid (e.g., PFPE) at approximately 125° C. Finally, the term "molded air cavity package" and the corresponding term "ACM package" refer to an air cavity package, as previously defined, and further including a package body principally or exclusively formed from one or more molded materials.

Overview

The following provides high performance ACM packages well-suited for housing various types of microelectronic devices. Such microelectronic devices include, but are not limited to, devices operable at relatively high radio frequencies exceeding 100 megahertz and, perhaps, approaching or exceeding approximately 6 gigahertz in certain instances. Advantageously, embodiments of the below-described ACM packages are amenable to fabrication utilizing efficient, repeatable, cost-effective manufacturing processes. Such manufacturing processes may involve the formation of molded package bodies around leadframes and base flanges, which may be mechanically joined prior to molding. In one useful approach, the base flanges are fabricated to include raised locating or piloting features, such as pillars or posts, which project upwardly from the upper principal surfaces or frontsides of the flanges and which are received through corresponding apertures provided in tab-like extensions included in the leadframes (herein, "retention tabs"). The pillars or posts may then be deformed in a controlled manner, such as by staking, to mechanically capture the base flanges against the leadframes and thereby ensure proper component positioning leading into and/or through the molding process, particularly as the leadframe-flange assemblies are loaded into the mold tooling. The ACM packages may be manufactured on an individual basis or, instead, fabricated in parallel by processing a leadframe array containing a relatively large number of interconnected leadframes. In the latter instance, the above-described mechanical capture process can be performed globally across a leadframe array to attach a plurality of base flanges to their respective leadframes prior to molding.

After spatial alignment of the base flanges relative to the leadframes, and possible mechanical capture of the flanges against the leadframes, the molded package bodies of the ACM packages are formed. Due to the design flexibility afforded by molding, the molded package bodies can be imparted with various different geometries and structural features, as tailored to best suit a particular application or package usage. In various embodiments, the molded package bodies may be formed to encompass or envelop any mechanical retention features located on the base flanges and the leadframes; e.g., in the above-described implementation wherein the base flanges are fabricated to include retention (e.g., staking) posts received through openings provided in the leadframes (e.g., specifically, in the above-described retention tabs), the molded package bodies may be formed to wholly envelope or cover corresponding post-tab pairs. Additionally, in the case of each ACM package, the molded package body may help define an open cavity through which a device mount area of the base flange is exposed, as viewed from the topside of the package prior to cover piece attachment. At least one microelectronic device is attached to the device mount area of the base flange and appropriate interconnections are formed by, for example, wirebonding. A lid or cover piece is then bonded to the upper peripheral edge portion or rim of the molded package body to sealingly enclose the air cavity and complete fabrication of the ACM package.

In certain embodiments, an organic pressure-sensitive adhesive, such as a die attach material, may be utilized to attach the microelectronic devices to the device mount areas of the base flanges. Alternatively, a metallic bonding material can be utilized. As a more specific example in this latter instance, a low temperature sinter bond process may be usefully employed for device attachment purposes. In addition to providing a highly robust metallurgical bond and diffusion at the device-flange interfaces in at least some instances, such a sinter bond process can be carried-out at relatively limited maximum processing temperatures (e.g., peak processing temperatures less than 300° C.) through the application of elevated heat, controlled convergent pressures, or both heat and convergent pressures. As the sintering process is carried-out at relatively low temperatures, material constraints placed on the package components are eased and issues associated with high temperature processing may be mitigated; e.g., warpage or other structural degradation of the molded package bodies potentially occurring at higher processing temperatures may be avoided. Furthermore, the resulting sintered bond layers can be produced with little to no voiding, controlled porosities, and highly controlled thicknesses to optimize performance parameters of the completed ACM package. Such sintered bond layers may contain lesser amounts of organic materials in implementations or, instead, may be essentially free of organic materials; the term "essentially free of organic materials" defined herein as containing less than 1% organic materials, by weight. Examples of processes suitable for forming such sinter bond layers and potential formulations of such layers are described in detail below.

Embodiments of the ACM package can be further imparted with an optimized cover-body interface in addition to or in lieu of the other features listed above. The optimized cover-body interface is formed between the lower peripheral edge of cover piece and the upper peripheral edge or rim of the molded package body to which the cover piece is bonded. As indicated by the term "optimized," the cover-body interface includes unique structural features, which guide precision alignment of the cover piece to the molded package body, which help ensure the formation of high integrity bond at the cover piece-package body juncture, and/or which provide other benefits enhancing the package fabrication process and the ACM packages produced thereby. Examples of such features and, more generally, of an optimized cover-body interface are discussed more fully below in conjunction with FIGS. 12-13. First, however, an exemplary ACM package is discussed in conjunction with FIGS. 1-2, while methods for fabricating the exemplary ACM package (along with a number of like ACM packages) are described below in conjunction with FIGS. 3-11.

Non-Limiting Example of a Molded Air Cavity Package

Figure 2:
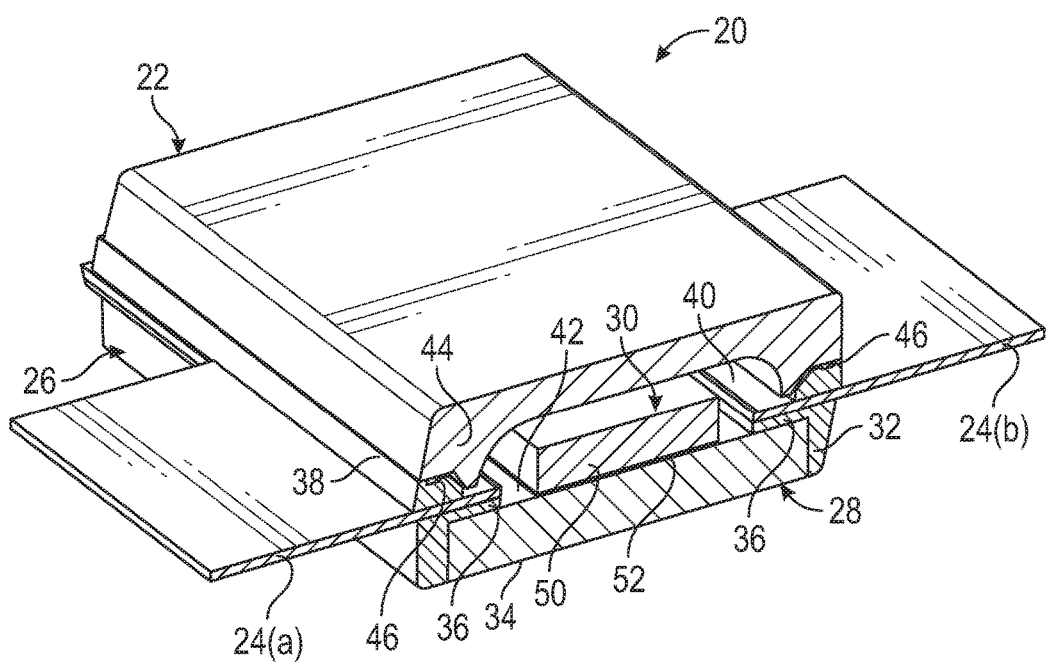

FIGS. 1 and 2 are cross-sectional views of a leaded ACM package 20, as illustrated accordance with an exemplary embodiment of the present disclosure. While realized as a leaded package in the illustrated example, ACM package 20 may assume other forms in alternative implementations, such as that of a no-lead package or a package containing leads of a different type. Progressing from top to bottom in FIGS. 1-2, leaded ACM package 20 includes a lid or cover piece 22, a plurality of package leads 24, a molded package body 26, and a base flange 28. Additionally, leaded ACM package 20 contains an air cavity 30, which is bounded and defined by cover piece 22, molded package body 26, base flange 28, and, to a lesser extent, package leads 24. As indicated above, air cavity 30 may contain air, another inert gas, or a gas mixture, and may or may not be partially evacuated or pressurized relative to the ambient environment. The hermicity of air cavity 30 will vary amongst embodiments, although ACM package 20 is usefully produced such that relatively little, if any leakage occurs between cavity 30 and the ambient environment.

Molded package body 26 can be formed to have various different geometries and structural features. In the illustrated example, molded package body 26 is formed to include a bottom edge portion or lower peripheral skirt 32; the terms "lower," "bottom," and similar terms of orientation defined based upon proximity to the bottom principal surface or backside 34 of base flange 28. Lower peripheral skirt 32 is bonded to and extends around base flange 28, as taken about the centerline of ACM package 20; the centerline of ACM package 20 identified in FIG. 1 by dashed line 35 and extending substantially orthogonal to the upper principal surface or frontside 42 of base flange 28. As indicated in FIG. 2, lower peripheral skirt 32 may be formed as a continuous wall, which extends fully around the outer periphery of base flange 28. In further embodiments, lower peripheral skirt 32 may be formed as an interrupted or discontinuous wall, as taken around the perimeter of base flange 28; or molded package body 26 may be formed to omit such a lower peripheral skirt.

The bottom principal surface or backside 34 of base flange 28 is exposed through a lower central opening, which is provided in molded package body 26 and which is peripherally bound by lower peripheral skirt 32. By exposing flange backside 34 from the exterior or underside of ACM package 20 in this manner, mounting or attachment of ACM package 20 within a larger system or device may be eased, while electrical connection to flange backside 34 may be facilitated as may be useful when, for example, flange 28 serves as a terminal of package 20. As another benefit, the exposed region of flange backside 34 may promote heat removal from ACM package 20 by conductive heat transfer through base flange 28. The foregoing benefits are generally optimized when at least a majority, if not the substantial entirety of flange backside 34 (considered by surface area) is exposed through peripheral skirt 32 of molded package body 26, as shown. This notwithstanding, flange backside 34 may not be exposed from the exterior of molded package body 26 or only a relatively limited area of backside 34 may be externally exposed in alternative embodiments of package 20.

With continued reference to FIGS. 1-2, molded package body 26 also contains one or more inwardly-extending ledge portions, referred to hereafter as "lead isolation shelves 36." Lead isolation shelves 36 underlie the inner terminal end portions of package leads 24, which extend into the package interior and to which device interconnections are formed. These terminal end portions of package leads 24 are identified in FIGS. 1-2 by reference numeral "40" and are referred to hereafter as "proximal" lead ends; the term "proximal," and the antonym "distal," defined based upon relative proximity to package centerline 35. Lead isolation shelves 36 extend from lower peripheral skirt 32 in an inward or inboard direction (that is, toward package centerline 35) and over an outer peripheral region of flange frontside 42. Lead isolation shelves 36 serve, in effect, as intervening dielectric layers, which reside between the respective lower surfaces of package leads 24 and flange frontside 42, as taken vertically through ACM package 20 along centerline 35. Lead isolation shelves 36 thus provide lead-flange electrical insulation, while further helping to mechanically join package leads 24 and base flange 28. Finally, as indicated in FIGS. 1-2, lead isolation shelves 36 may surround the peripheral surfaces of proximal lead end portions 40, while leaving exposed the upper surfaces of proximal lead end portions 40 from within the package interior for subsequent electrical interconnection.

Molded package body 26 further includes an upper edge portion or peripheral rim 38, which is formed over proximal lead end portions 40 opposite lower peripheral skirt 32. Upper peripheral edge portion 38 extends around air cavity 30 and, in combination with cover piece 22, largely bounds or defines the periphery of cavity 30. In addition to providing a controlled vertical separation or standoff between cover piece 22 and package leads 24 along package centerline 35, upper peripheral edge portion 38 also serves as a physical interface for mating engagement with cover piece 22. Accordingly, upper peripheral edge portion 38 may be imparted with a planform shape and dimensions generally corresponding with the planform shape and dimensions of a lower peripheral edge 44 of cover piece 22. Additionally, upper peripheral edge portion 38 and/or lower peripheral edge 44 may be imparted with certain features facilitating cover piece attachment and the formation of a high integrity bond between cover piece 22 and molded package body 26, as described below. Alternative embodiments of molded package body 26 may lack upper peripheral edge portion 38, which may be replaced by another, discretely-fabricated structure (e.g., a window frame) or may be rendered unneeded by direct bonding of lower peripheral edge 44 to proximal lead end portions 40. Generally, however, cover piece attachment can be enhanced through the provision of such an upper peripheral edge portion, which is advantageously formed with lower peripheral skirt 32 and lead isolation shelves 36 as a single, integrally-formed molded structure or body.

ACM package 20 can contain any number and type of microelectronic devices, which can be interconnected as appropriate to yield, for example, an SiP. Such microelectronic devices can include IC-carrying semiconductor die, MEMS die, optical sensors, and passive devices, such as discrete inductors, resistors, diodes, and capacitors, to list but a few examples. In the relatively simple example shown in FIGS. 1-2, ACM package 20 contains a single microelectronic device 50, such an RF power transistor die or another IC-bearing semiconductor die. Microelectronic device 50 includes a lower surface or backside, which is attached to flange frontside 42 by at least one device bond layer 52.

Device bond layer 52 can be composed of a die attachment material, such as an epoxy and a pressure-sensitive adhesive, in an embodiment. Alternatively, device bond layer 52 may be formed from a metallic-based bonding material; that is, a bonding material predominately composed of one or more metallic constituents, by weight. In certain embodiments, device bond layer 52 is formed utilizing a low temperature sintering process in which metal particles (e.g., Cu, Ag, and/or Au particles in the nanometer or micron size range) are densified to form the desired bond layer. In such embodiments, device bond layer 52 may consist essentially of metallic materials; or, instead, may contain lesser amounts of non-metallic constituents, such as one or more organic materials added to enhance targeted bond layer properties. If desired, and as exclusively shown in FIG. 1, a containment layer or bead 60 may also be formed around the outer periphery of device bond layer 52 when composed of metallic material, such as a Ag-based material, prone to migration. Sinter containment bead 60 can be produced from an epoxy or another polymeric material suitable for usage as a dam or blockade feature, which physically impedes or blocks undesired migration of device bond layer 52 (when formed as a sintered bond layer). Low temperature sintering processes suitable for forming device bond layer 52 are discussed more fully below in conjunction with FIG. 11.

With continued reference to FIGS. 1-2, base flange 28 can be any body of material, layered structure, or composite structure serving as a substrate or carrier supporting microelectronic device 50. Base flange 28 may serve as an electrically-conductive terminal of ACM package 20 and, perhaps, as a heat sink or heat spreader. Base flange 28 may thus assume the form of a monolithic metallic structure, plate, slug, or the like in certain implementations. In other implementations, base flange 28 may itself assume the form of a printed circuit or wiring board. Base flange 28 may be produced from, for example, an organic material (e.g., a resin similar or identical to that from which printed circuit boards are produced) containing metal (e.g., Cu) coining. In other embodiments, base flange 28 may have a multilayer metallic construction; e.g., base flange 28 may contain multiple thermally-conductive layers, which are bonded in a stacked or laminated arrangement. Base flange 28 will typically be composed predominately of one or more metals having relatively high thermal conductivies, such as Cu. As a more specific example, in an embodiment wherein base flange 28 is a layered or laminated structure, base flange 28 may include at least one Cu layer combined with at least one disparate metal layer having a CTE less than that of the Cu layer. The disparate metal layer may be composed of, for example, Mo, a Mo—Cu alloy, or a Mo—Cu composite material. In this manner, base flange 28 may be imparted with both a relatively high thermal conductivity and a lower effective CTE, which is more closely matched to that of microelectronic device 50 and/or to that of molded package body 26. Thermally-induced stress within ACM package 20 may be favorably reduced as a result.

Circuitry may be formed on the frontside of microelectronic device 50, along with a number of bond pads 54. As shown exclusively in FIG. 1, bond pads 54 can be electrically interconnected with proximal lead end portions 40 utilizing, for example, a number of wire bonds 56. In alternative implementations, ACM package 20 may be a no-lead package or another interconnection approach may be employed to electrically interconnect bond pads 54 of device 50 with corresponding package terminals. In one embodiment, a first lead 24(a) projects from a first side of ACM package 20 and serves as an input lead electrically coupled to the input (e.g., gate) terminal of microelectronic device 50; while a second lead 24(b) projects from a second, opposing side of package 20 and serves as an output lead electrically coupled to the output (e.g., drain) terminal of device 50. In certain instances, base flange 28 may itself serve as a ground reference terminal of ACM package 20 and, therefore, may be electrically coupled to a source terminal of device 50. Again, while shown as containing a single microelectronic device 50 in FIGS. 1-2, ACM package 20 can contain any number and type of microelectronic devices operably coupled utilizing various interconnection schemes. For example, in a further implementation, ACM package 20 may contain two or more microelectronic device 50 electrically coupled in series or parallel between any practical number of package leads 24(a)-(b).

After installation of microelectronic device 50, and interconnection of device 50 with package leads 24, cover piece 22 is positioned over molded package body 26 and bonded to upper peripheral edge portion 38 to sealingly enclose air cavity 30. Lower peripheral edge 44 of cover piece 22 may be bonded to upper peripheral edge portion 38 of molded package body 26 by a ring of bonding material 46, which is referred to hereafter as "cover bond layer 46." Cover bond layer 46 can be composed of any material or materials suitable for mechanically attaching cover piece 22 to molded package body 26, while forming a gas-tight or substantially gas-tight seal around the periphery of the cover-body interface. For example, cover bond layer 46 may be composed of a metallic-based bonding material, which may be formed utilizing a low temperature sintering process similar to that mentioned above and described more fully below as advantageously utilized to produce device bond layer 52. Alternatively, cover bond layer 46 can be formed from a dispensed (e.g., high temperature) epoxy, a B-stage epoxy, or another die attachment material. An exemplary process for fabricating ACM package 20 will now be described in conjunction with FIGS. 3-13.

Examples of Air Cavity Package Fabrication Methods

Figure 3:
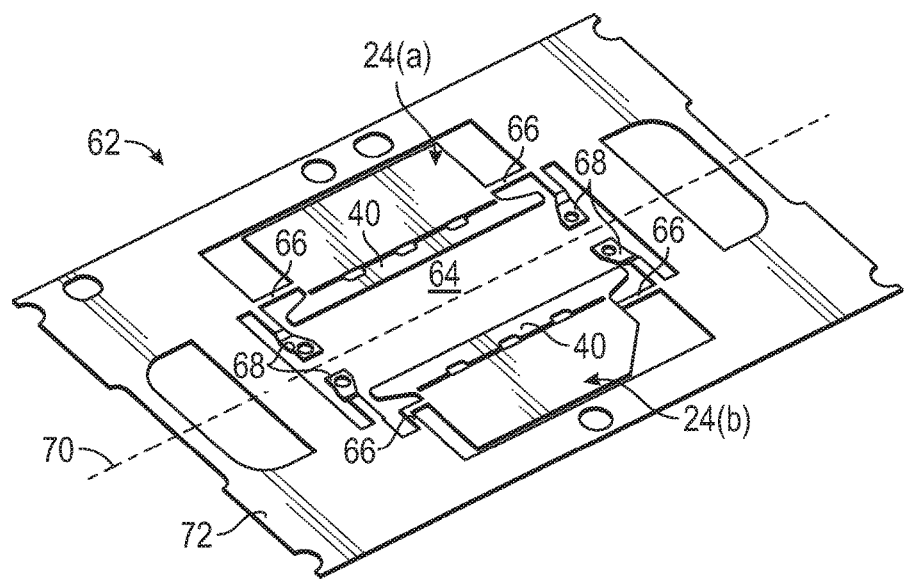
FIGS. 3-11 illustrate the ACM package shown in FIGS. 1-2, as shown at various stages of completion and fabricated in an accordance an exemplary ACM package fabrication process.

Whether produced on an individual basis or in parallel with a number of other ACM packages, ACM package 20 is conveniently fabricated utilizing a leadframe-based manufacturing approach. In particular, ACM package 20 may be manufactured to incorporate a leadframe, which contains package leads 24 and other physically-interconnected features, at least some of which may be removed during the course of ACM package fabrication. An example of a leadframe 62 suitable for usage in the manufacture of ACM package 20 is shown in FIG. 3. In this example, leadframe 62 is fabricated as a relatively thin strip or plate-like body composed of a metallic material, such as Cu or a Cu-based alloy. The body of leadframe 62 is machined (e.g., stamped), etched, laser cut, or otherwise processed to define the various leadframe features of leadframe 62. In addition to package leads 24, these features include a central opening 64; a number of connective fingers or spars (herein, "dam bars 66"), a plurality of retention tabs 68, and an outer peripheral leadframe portion 72. Dam bars 66 join package leads 24 and retention tabs 68 to the plate-like body of leadframe 62. Additionally, dam bars 66 may facilitate handing and positioning of leadframe 62 leading into and, perhaps, through the molding process. After molding, dam bars 66 may be severed and removed along with other sacrificial leadframe portions, such as outer peripheral leadframe portion 72. Outer peripheral leadframe portion 72 may likewise include various openings or cutouts facilitating handling of leadframe 62 during ACM package fabrication.

Retention tabs 68 extend laterally inwardly of package leads 24; that is, toward the longitudinal axis of leadframe 62 represented in FIG. 3 by dashed line 70. Notably, retention tabs 68 are formed to extend, at least in part, in a different horizontal plane than does the remainder of leadframe 62 including package leads 24; the term "horizontal plane," as appearing herein, referring to a plane orthogonal to package centerline 35 (FIG. 1) and, perhaps, parallel to flange frontside 42 (FIGS. 1-2). Retention tabs 68 thus provide a vertical separation or standoff between base flange 28 (FIGS. 1-2) and leadframe 62 when placed in contact therewith. This vertical standoff is shown more clearly in FIG. 7 (addressed below) and enables the formation of lead isolation shelves 36 during molding. The inner terminal ends of retention tabs 68 are also imparted with openings, through holes, or apertures. These opening serve as locating or registration features, which receive corresponding raised locating features, such as staking posts of the type described below, to precisely position base flange 28 relative to leadframe 62 and, particularly, relative to package leads 24. Further description in this regard is set-forth below in conjunction with FIGS. 5-8. In further embodiments, leadframe 62 can be fabricated to omit such features and/or to contain other structural features in addition to those shown in FIG. 3, such as additional sets of package leads.

Figure 4:
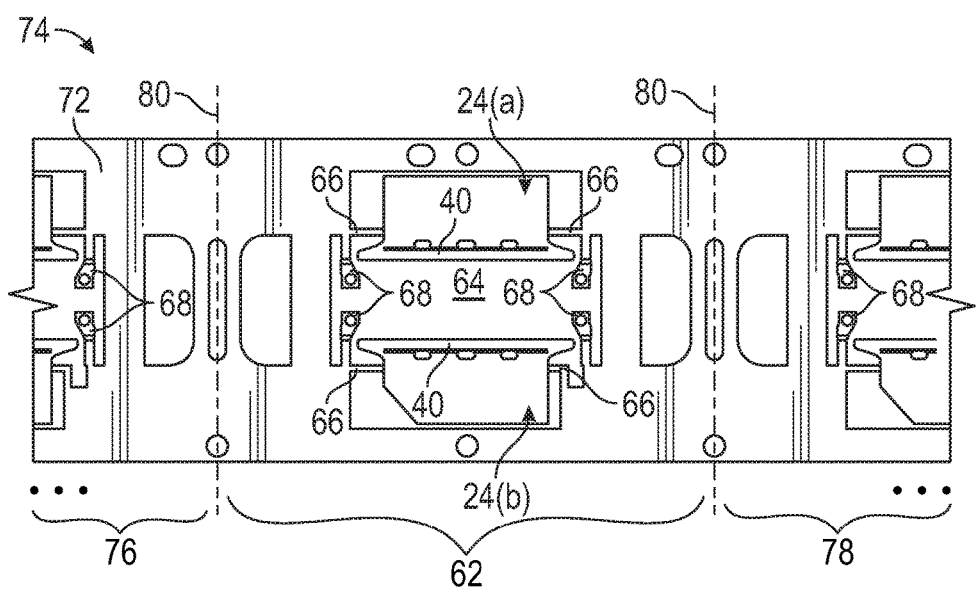

If desired, ACM package 20 may be fabricated as a discrete unit by individually processing leadframe 62 as a pre-singulated structure. However, process efficiencies will typically be increased and manufacturing costs lowered by manufacturing ACM package 20 in parallel with a relatively large number of similar ACM packages. In this regard, ACM package 20 may be produced in parallel with other, non-illustrated ACM packages by concurrently processing a plurality of leadframes interconnected as a leadframe array. Such a leadframe array can contain relatively large number of leadframes arranged in, for example, a two dimensional grid layout or a linear strip layout. By way of example, FIG. 4 illustrates a limited portion of a leadframe array 74, which has a strip-like form factor and which contains leadframe 62 along with a number of other leadframes. As can be seen, the illustrated portion of leadframe array 74 contains leadframe 62 along with two additional leadframes 76, 78 (partially shown) adjoined to opposing edge portions of leadframe 62. For clarity, dashed lines 80 generally demarcate the boundaries between leadframes 62, 76, 78 in FIG. 4. Leadframe array 74 may be considerably larger than the illustrated portion and can contain any practical number of interconnected leadframes, which are subsequently singulated (e.g., by sawing, water jetting, laser cutting, or the like) at a later juncture during package fabrication. The below-described process steps can thus be performed globally across a leadframe array, such as leadframe array 74 (FIG. 4), to manufacture a plurality of additional ACM packages in parallel with ACM package 20 when desired.

Figure 5:
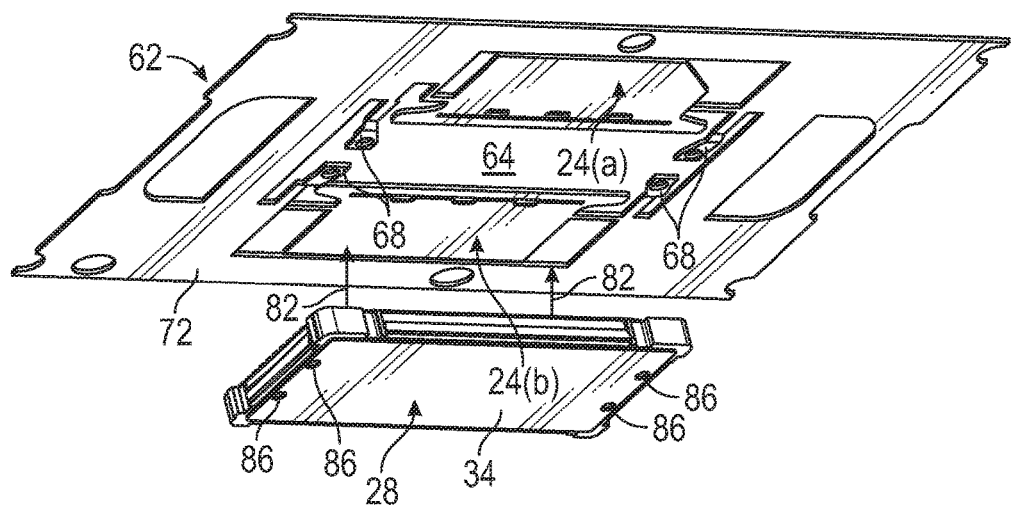
Figure 6:
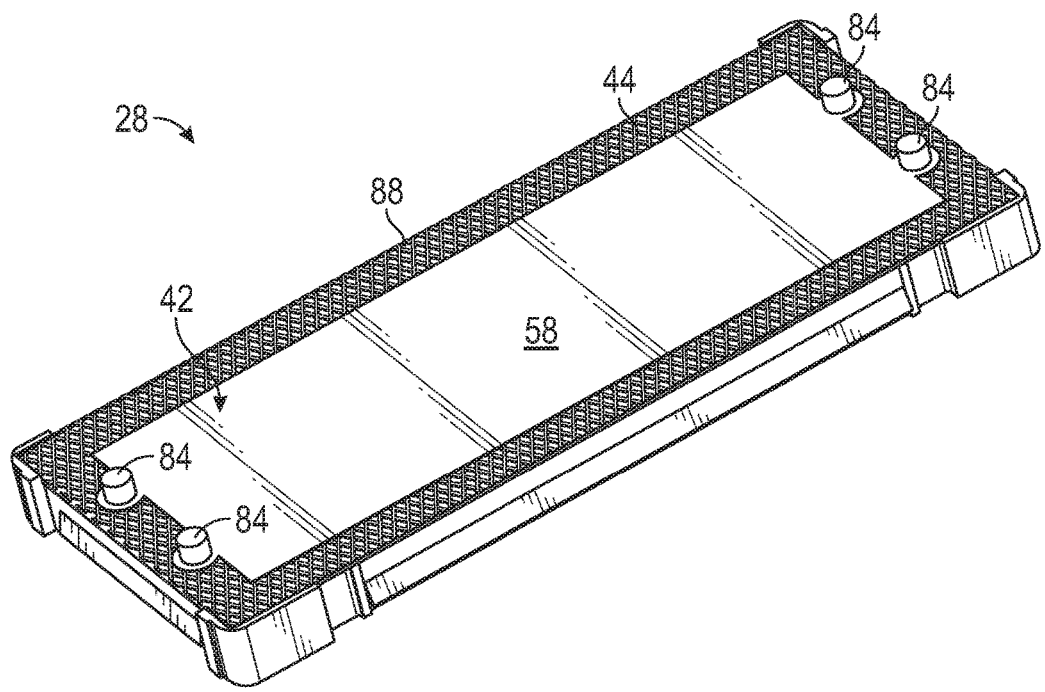

Advancing to FIGS. 5-6, base flange 28 is next positioned with respect to leadframe 62 utilizing, for example, a pick-and-place tool. Base flange 28 can be positioned with respect to leadframe 62 by positioning or movement of flange 28, movement of leadframe 62, or a combination thereof. As a more specific example, and referring to the exemplary orientation of base flange 28 and leadframe 62 shown in the drawing figures, base flange 28 may be placed on a temporary support structure, carrier, or fixture; and leadframe 62 may be lowered onto flange 28 to achieve the desired positioning. Such an approach may be useful when a plurality of ACM packages are manufactured in parallel. In this case, an appropriate number of base flanges can be distributed across such a carrier or fixture, and a leadframe array (e.g., array 74 shown in FIG. 4) may then be lowered into its desired position to concurrently position the interconnected leadframes relative to the array of base flanges. Alternatively, the illustrated orientation of base flange 28 and leadframe 62 may be inverted, and base flange 28 may be lowered onto leadframe 62 during flange-leadframe positioning. In either case, as indicated in FIG. 5 by arrows 82, frontside 42 of base flange 28 is positioned against the underside of leadframe 62 and, specifically, placed in direct or intimate physical contact with retention tabs 68.

As previously indicated, base flange 28 is advantageously produced to contain certain dedicated locating or piloting features, which physically register or pilot with corresponding features provided on leadframe 62. Examples such locating features are shown in FIG. 6, which depicts base flange 28 as including a number of raised pillars or posts 84 (herein, "retention posts 84"). Retention posts 84 project upwardly from frontside 42 of base flange 28 and are received through the openings or apertures provided in retention tabs 68. Base flange 28 is produced to include a number of retention posts 84 equivalent to the retention tab count, with the spatial distribution, shape, and outer diameters of posts 84 generally matching the distribution, shape, and inner diameters of the openings provided in retention tabs 68. For reasons of mechanical integrity, part count reduction, and/or process efficiency, retention posts 84 are usefully formed as integral features of base flange 28, rather than as discrete features subsequently bonded to or otherwise joined to flange frontside 42. In one approach, retention posts 84 are produced utilizing a punching operation during which localized regions of base flange 28 are deformed upwardly (toward flange frontside 42) by application of a controlled, localized strike force to selected regions of flange backside 34. Correspondingly, such a punching operation may also form recesses, blind tunnels, or divots 86 in backside 34 of flange 28, as shown most clearly in FIG. 5. Once formed, divots 86 can also be leveraged for alignment or handling purposes and engaged by a specialized fixture in embodiments of the ACM package fabrication method.

In certain implementations, base flange 28 may be fabricated to include at least one texturized surface are or region. As appearing herein, a surface region is considered "texturized" when imparted with a non-planar surface topology having an average feature height or depth exceeding 1 µm. In this case, base flange 28 can be imparted with any number of texturized surface regions, which are advantageously formed at locations contacted by molded package body 26 (FIGS. 1-2) to increase the integrity of the mechanical bond formed at the molded package body-flange interfaces. In the illustrated example, specifically, base flange 28 is fabricated to include a peripheral knurled surface region 88, which extends over an outer peripheral portion of flange frontside 42 and which may be imparted with a ring-shaped planform geometry. Knurled surface region 88 extends around device mount area 58 and may thus underlie proximal end portions 40 of package leads 24 and lead isolation shelves 36 when ACM package 20 is completed, as considered when progressing along centerline 35 from cover piece 22 toward flange backside 34. Consequently, in such embodiments, lead isolation shelves 36 may intimately contact and be directly bonded to knurled surface region 88 following formation of molded package body 24, as described below in conjunction with FIGS. 9-11. Finally, as shown in FIG. 6, knurled surface region 88 may be formed adjacent the junctures between retention posts 84 and flange frontside 42 such that posts 84 generally extend from surface region 88 in an upward direction opposite frontside 42. In further embodiments, selected surface regions of base flange 28 may be texturized in a different manner (e.g., the outer perimeter of flange 28 may be knurled or otherwise texturized), or base flange 28 may lack any such texturized regions.

Continuing with the exemplary ACM package fabrication process, in at least some implementations, base flange 28 is next mechanically captured against leadframe 62. In this regard, process steps may now be performed to physically retain base flange 28 and leadframe 62 in their desired, intimately-contacting positions, thereby preventing flange-leadframe separation along centerline 35 in a direction away from leadframe 62; that is, in a direction opposite the insertion axis generally parallel to arrows 82 shown in FIG. 5 and along which posts 84 are inserted into the openings provided in retention tabs 68. In various embodiments, this may be accomplished by deforming, in a controlled manner, the terminal ends of the raised locating features (posts 84 in the illustrated example) after positioning base flange 28 against leadframe 62. In certain implementations, a crimping or bending operation can be carried-out to physically capture base flange 28 against leadframe 62. In other embodiments, a staking process may be carried-out to laterally expand the outer terminal ends or "staking heads" of posts 84 to prevent flange-leadframe disengagement. When staked or intended for staking in this manner, the more specific term "staking post" rather than the more generic term "retention post" may be utilized in reference to posts 84. By way of non-limiting example, additional description of a staking process suitable for mechanically capturing base flange 28 against leadframe 62 will now be provided in conjunction with FIGS. 7-8.

Figure 7:
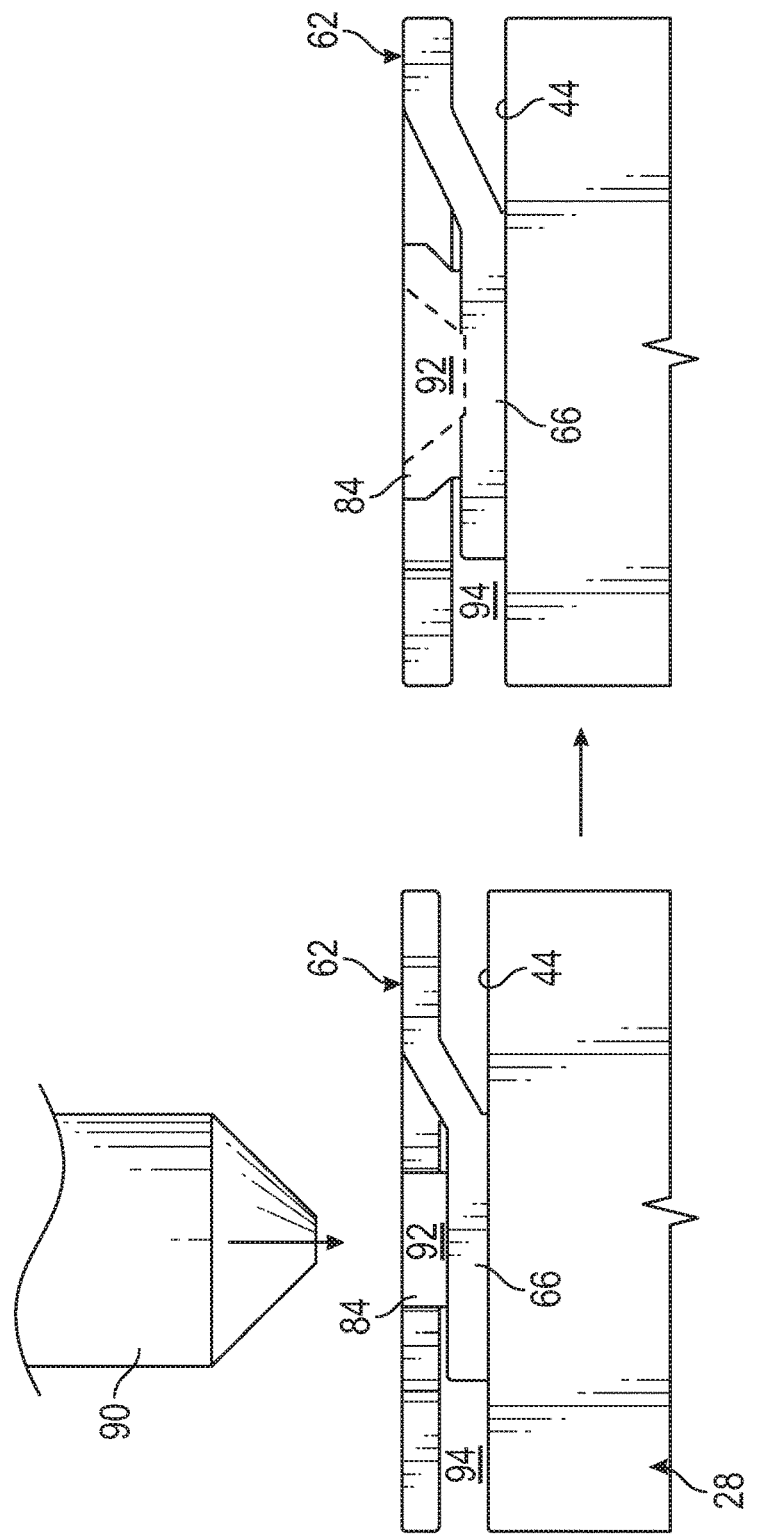
Figure 8:
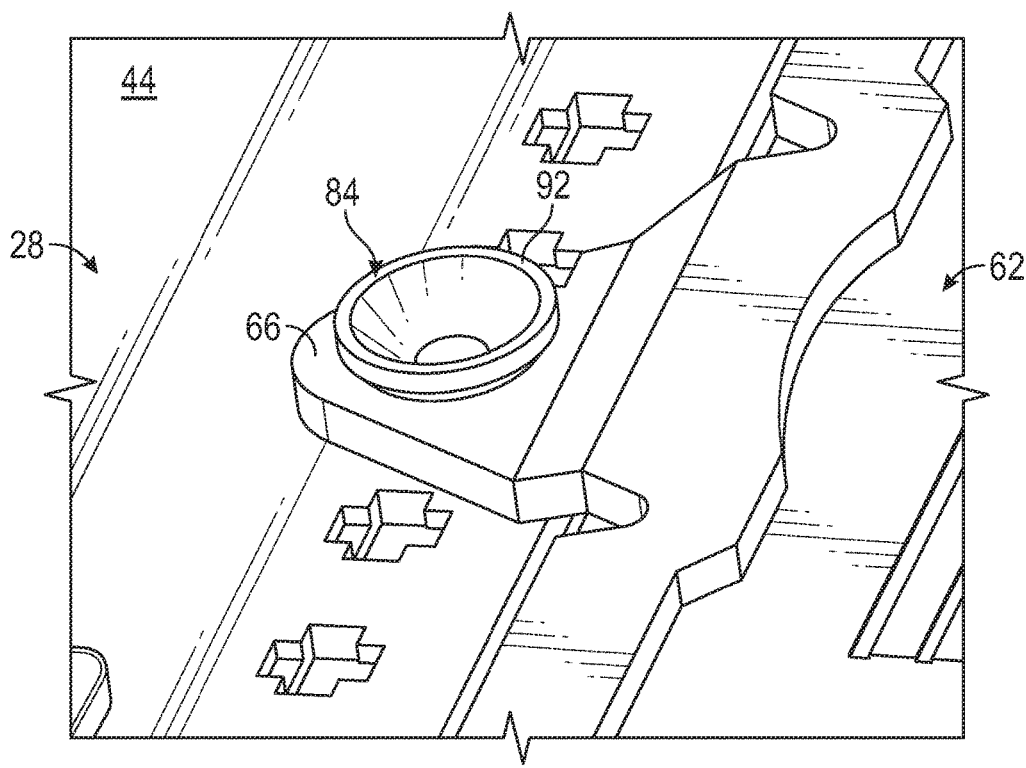

FIG. 7 illustrates, in step-by-step increments, a staking operation suitably performed to physically deform one of retention posts 84 after insertion through a corresponding retention tab opening provided in leadframe 62. As indicated on the left side of FIG. 7, a staking tool 90 is brought into contact with a head portion 92 of retention post 84. Sufficient pressure is applied to circumferentially-expand or splay-out head portion 92, as further shown on the right side of FIG. 7. The resultant structure is also shown from an isometric perspective view in FIG. 8. Heat may or may not be applied during the staking process, which may be repeated on an iterative basis to circumferentially-expand the head portions of the other retention posts 84 shown in FIG. 6. By circumferentially-expanding head portion 92 of each retention post 84 in this manner, each head portion 92 may be physically prevented from passing through its corresponding opening in retention tab 68 and base flange 28 may be captured against leadframe 62. Precise alignment along a horizontal plane (orthogonal to the plane of the page in FIG. 7) between base flange 28 and leadframe 62 may therefore be ensured, while vertical leadframe-flange separation is prevented leading into and/or through the subsequently-performed molding operation. Following staking, the expanded head portion 92 may feature a depression or cavity, which may have a generally frustoconical shape, as shown in phantom line on the right side of FIG. 7 and further shown in FIG. 8.

Figure 9:
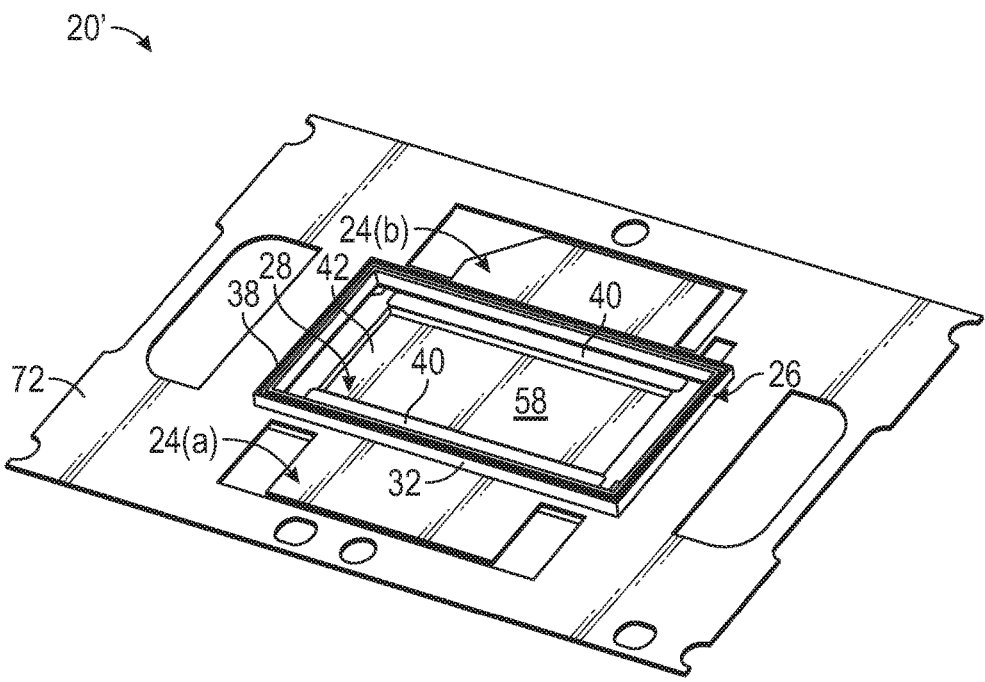
Figure 10:
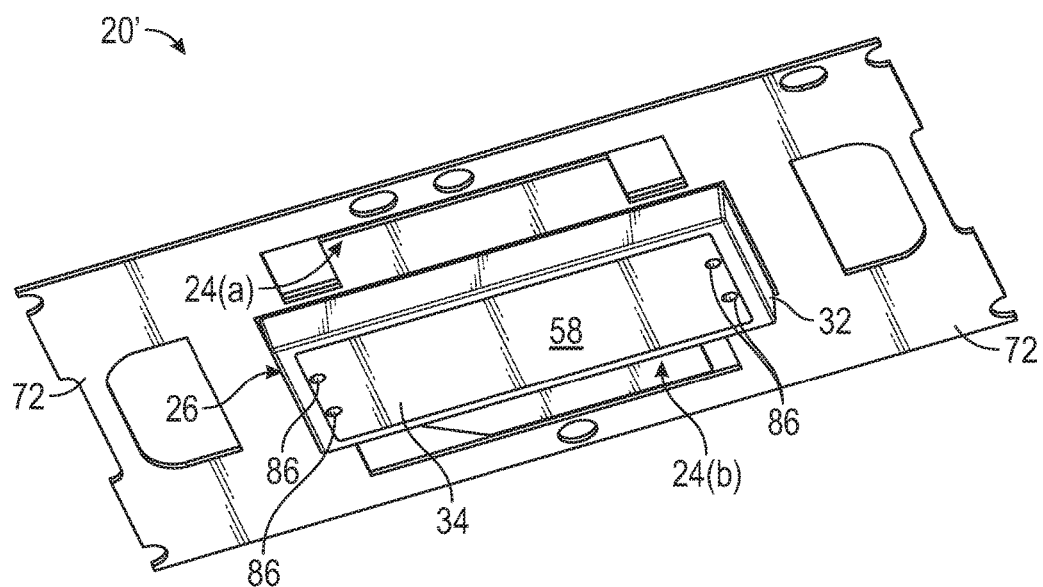

Turning to FIGS. 9-10, the molding process in next carried-out to create molded package body 26 over and around selected regions of leadframe 62 and base flange 28. As shown most clearly in FIG. 9, molded package body 26 is produced to include an open upper end such that air cavity 30, not yet enclosed by cover piece 22, opens in an upward direction away from base flange 28. As noted above, molded package body 26 is formed so as to leave exposed device mount area 58 of base flange 28 and proximal lead end portions 40 of package leads 24. In contrast, molded package body 26 may wholly envelope retention tabs 68 and retention posts 84 (FIGS. 7-8) such that tabs 68 and posts 84 are buried within package body 26 and therefore hidden from view from the package exterior. At some juncture following the molding process, selected portions of leadframe 62 may be severed or trimmed away including, for example, dam bars 66 and outer peripheral leadframe portion 72 identified in FIGS. 3-4. Additionally, the outer end portions of retention tabs 68 (that is, the ends of tabs 68 adjacent dam bars 66 as best seen in FIGS. 3-4) may be severed such that tabs 58 are imparted with singulated surfaces visible from an exterior of molded package body 26 in the completed package. Leadframe singulation or trimming therefore results electrical isolation of package leads 24, which may otherwise be electrically bridged to base flange 28 by dam bars 66 and retention tabs 68. As dam bars 66 have been severed and partially or wholly trimmed away, retention tabs 68 are no longer physically and electrically coupled to package leads 24 through dam bars 66. Processes suitable for singulating or trimming leadframe 62 include, but are not limited to, sawing, laser cutting, water jetting, stamping, scribing (with or without punching), and routing.

Figure 11:
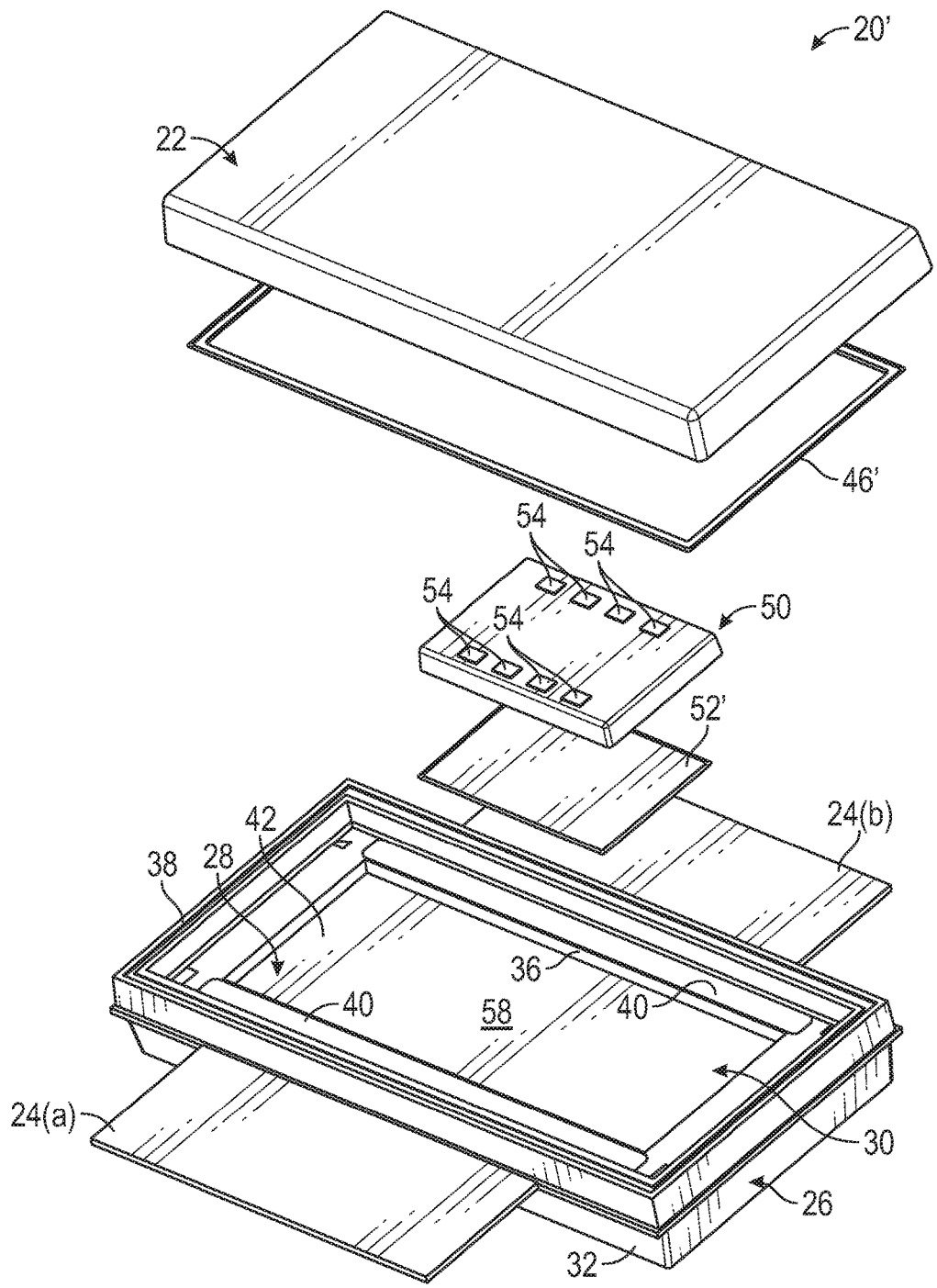

At this juncture in the fabrication process, ACM package 20 is now near completion. The remaining principal process steps remaining for ACM package completion are device installation, interconnection formation, and cover piece attachment. The physical features associated with such backend process steps are shown in FIG. 11, which is an exploded isometric view of package 20 in a partially-completed state. As package 20 is shown in partially-completed state in FIG. 11, a prime symbol (') is appended to the end of reference numeral "20" and when referring to the partially-completed package below. In certain cases, the backend process steps may be performed by an entity distinct from that which performed the previously-described frontend process steps. In this regard, a first entity (herein, the "supplier") may produce ACM package 20' in its partially-completed state shown in FIG. 11, but lacking installed devices, electrical interconnections, or bonded cover pieces. The supplier may then ship or otherwise provide partially-completed ACM package 20' (along with other partially-completed ACM packages and mating cover pieces) to a second entity (herein, the "customer"). The customer may then perform the device installation, interconnection formation, and cover piece attachment processes at a subsequent point in time. In still other instances, a single entity may perform all process steps involved in ACM package fabrication or the various ACM package fabrication process steps may be divided amongst multiple entities in a different manner.

Continuing with the exemplary ACM package fabrication process, one or more microelectronic device are now installed within air cavity 30 of ACM package 20' (FIG. 11). Device attachment can be performed utilizing any suitable adhesive or bonding material including organic pressure-sensitive adhesives, such commercially-available die attach materials. Alternatively, device attachment may be conducted utilizing a metallic-based bonding process, such as a low temperature sintering process of the type briefly mentioned above and described more fully below. To produce such sintered bond layer(s), one or more layers of metal particle-containing precursor material may be obtained, applied to the appropriate regions of ACM package 20', and then processed to transform the bond layer precursor material into the sintered bond layer(s). Examples of low temperature sintering processes suitable for forming one or more sintered bond layers, and specifically device bond layer 52 shown in FIGS. 1-2, will now be described.

When a low temperature sinter bond process is utilized to produce device bond layer 52 (FIGS. 1-2), a metal particle-containing precursor layer 52' (FIG. 11) may first be applied at the interface of microelectronic device 50 and device mount area 58 of base flange 28. Precursor layer 52' can be applied to the backside of device 50, which is then positioned (e.g., utilizing a pick-and-place tool) in its desired location on flange frontside 42. Alternatively, precursor layer 52 may be applied directly to device mount area 58, and microelectronic device 50 may then be placed or seated thereupon. Generally, precursor layer 52' may be applied as a patterned or continuous layer having a planform shape and dimensions roughly corresponding to that of microelectronic device 50. Metal particle-containing precursor layer 52' can be applied utilizing a wet state or dry state application technique of the type described below, and a low temperature sintering process may then be carried-out. Additional description of precursor material application and sintering processes suitable for usage in the fabrication of ACM package 20 will now be discussed in detail. Further description of such processes can also be found in the following co-pending U.S. patent applications, which are further incorporated by reference: U.S. patent application Ser. No. 15/269,629, filed with the United States Patent and Trademark Office on Sep. 19, 2016, and entitled "AIR CAVITY PACKAGES AND METHODS FOR THE PRODUCTION THEREOF"; and U.S. patent application Ser. No. 15/363,671, filed with the United States Patent and Trademark Office on Nov. 29, 2016, and entitled "MICROELECTRONIC MODULES WITH SINTER-BONDED HEAT DISSIPATION STRUCTURES AND METHODS FOR THE FABRICATION THEREOF."

Wet state application techniques suitable for applying metal particle-containing precursor layer 52' include, but are not limited to, screen or stencil printing, doctor blading, spraying, dipping, and fine needle dispense techniques. When a wet state application technique is employed, a flowable or wet state coating precursor material is initially obtained by, for example, independent production or purchase from a third party supplier. In addition to metal particles (described below), the wet state coating precursor material contains other ingredients (e.g., a solvent and/or surfactant) to facilitate wet set application, to adjust the viscosity of the precursor material, to prevent premature agglomeration of the metal particles, or to serve other purposes. In one embodiment, the wet state coating precursor material contains metal particles in combination with a binder (e.g., an epoxy), a dispersant, and a thinner or liquid carrier. The volume of solvent or liquid carrier contained within the coating precursor material can be adjusted to tailor of the viscosity of the precursor material to the selected wet state application technique. For example, in embodiments wherein the precursor material is applied by screen printing or doctor blading, the coating precursor material may contain sufficient liquid to create a paste, slurry, or paint. After application of the wet state coating material, a drying process can be carried-out to remove excess liquid from the metal particle-containing precursor material, if so desired.

In further embodiments, metal particle-containing precursor layer 52' can be applied utilizing a dry state application technique. For example, a film transfer process can be employed to apply precursor layer 52' to the appropriate surfaces of base flange 28 or microelectronic device 52. In this regard, a dry film may first be prepared by, for example, initially depositing (e.g., screen printing or otherwise dispensing) one or more metal particle-containing precursor layer 52' onto a temporary substrate or carrier, such as a plastic (e.g., polyethylene terephthalate) tape backing. The metal particle-containing precursor layer 52' may be applied to the carrier in a wet, flowable state and then heated or otherwise dried to yield a dry film, which is transferred to the appropriate package component surfaces. Heat, pressure, or both heat and pressure are then applied to adhere the metal particle-containing precursor layer (dry film) to the appropriate component surfaces. The carrier (e.g., tape backing) may then be removed by physical removal (e.g., peeling away) or by dissolution in a chemical solvent. In still further embodiments, one or more freestanding films may simply be positioned between the air cavity package components during the stacking or build-up process (also considered "film transfer" in the context of this document) by, for example, positioning a freestanding film over base flange 28 prior to placement of device 50.

The metal particles dispersed within metal particle-containing precursor layer 52' can have any composition, shape, and size enabling the particles to form a substantially coherent adhesive layer pursuant to the below-described sintering process. In one embodiment, metal particle-containing precursor layer 52' contains Au, Ag, or Cu particles, or a mixture thereof. In another embodiment, the metal particles contained within the precursor layer 52' consist essentially of Ag or Cu particles. The metal particles contained within precursor layer 52' may or may not be coated with an organic material. For example, in some implementations, the metal particles may be coated with an organic dispersant, which prevents physical contact between the particles to inhibit premature agglomeration or particle sintering. When present, any such organic particle coating may be burned away or thermally decomposed, whether in whole or in part, during the below-described metal sintering process. In still further embodiments, other material systems amenable to low temperature sintering, whether currently known or later developed, may be utilized in the ACM package fabrication process.

The metal particles contained within precursor layer 52' can have any shape or combination of shapes including, but not limited to, spherical shapes, oblong shapes, and platelet or laminae shapes. The average dimensions of the metal particles will vary in conjunction with particle shape and process parameters. However, in general, the average maximum dimension of the metal particles (e.g., the diameter of the metal particles when spherical or the major axis of the metal particles when oblong) may be between about 100 microns ($\mu$m) and about 10 nanometers (nm) in an embodiment. In other embodiments, the metal particles may have average maximum dimension greater than or less than the aforementioned range. In certain implementations, a mixture of metal particles having average maximum dimensions in both the nanometer and micron range may be present within the precursor material. In other implementations, only nanoparticles (that is, particles having average maximum dimension between 1 and 1000 nm) may be contained within metal particle-containing precursor layer 52'. As a specific, albeit non-limiting example, precursor layer 52' may contain at least one of Ag, Au, or Cu nanoparticles or micron-sized particles in an embodiment, with Ag or Cu nanoparticles being preferred.

After application of metal particle-containing precursor layer 52' and placement of microelectronic device 50, a low temperature sintering process is performed to produce a sintered bond layer forming, in this example, device bond layer 52 (FIGS. 1-2). The low temperature sintering process can be carried-out under any process conditions suitable for transforming precursor layer 52' into a sintered bond layer, noting that some diffusion may occur from precursor layer 52' into base flange 28. The sinter bond process thus advantageously forms low stress, mechanically-robust, solid state metallurgical diffusion bonds at the bond joint interfaces. The sintering process may be performed with or without pressure, with or without heating (although some degree of elevated heat will typically be applied), and in any suitable atmosphere (e.g., open air or in the presence of an inert gas, such as nitrogen). As a point of emphasis, the sintering process is carried-out at maximum processing temperatures ($T_{MAX}$) less than the melt point of the metal particles contained within the precursor layer 52'. Indeed, in many embodiments, $T_{MAX}$ will be significantly less than the melt point of the metal particles and, perhaps, less than one half the melt point of the particles considered on an absolute temperature scale (in Kelvin). Generally, $T_{MAX}$ will be greater than room temperature (considered 20° C. herein) and less than 300° C. Comparatively, the melt point of Ag, Au, and Cu particles in a nanometer or micron size range will commonly range between approximately 950° C. to 1100° C. To provide a still further example, $T_{MAX}$ may be between approximately 170° C. and 300° C. in an embodiment. In still further embodiments, $T_{MAX}$ may be greater than or less than the aforementioned range, providing that $T_{MAX}$ (in conjunction with the other process parameters) is sufficient to induce sintering of the metal particles without liquefaction of the metal particles.

A multistage heating schedule can be employed during the sintering process. In this case, the multistage heating schedule may entail heating partially-fabricated ACM package 20' (and any other ACM packages produced in parallel therewith) when the air cavity packages are produced utilizing a panel-level fabrication process such as that previously described) to a first temperature ($T_1$) less than $T_{MAX}$ for a first time period, gradually increasing or ramping-up the temperature process to $T_{MAX}$, and then maintaining $T_{MAX}$ for a second time period. A cool down period may follow. In one embodiment, and by way of non-limiting example only, $T_1$ may range from approximately 100 to 200° C., while $T_{MAX}$ is greater than $T_1$ and ranges from approximately 170 to 280° C. As discussed below, the process parameters employed may or may not be controlled to fully decompose any organic material from metal particle-containing precursor layer 52' during the sintering process.

In at least some implementations of the ACM package fabrication method, a controlled convergent pressure or compressive force is applied across the partially-fabricated air cavity packages during the sintering process. When applied, the convergent pressure can be delivered as a substantially constant force or, instead, varied in accordance with a time-based or temperature-based schedule. Any suitable mechanism can be utilized to apply the desired convergent pressure including bulk weights, resilient bias devices (e.g., spring-loaded plungers or pins), clamps, hydraulic presses, and the like. The pressure applied may be selected based upon various factors including the desired final thickness of the sintered bond layer, the desired porosity of the sintered bond layer, and the composition of metal particle-containing precursor layer 52'. In one embodiment, and by way of non-limiting example only, a maximum pressure ($P_{MAX}$) ranging between about 0.5 and about 20 megapascal is applied during the sintering process. In other embodiments, $P_{MAX}$ may be greater than or less than the aforementioned range, if pressure is applied during the sintering process.

As indicated briefly above, the sintered bond layer produced pursuant to the above-described metal sintering process may be composed predominately of one or more sintered metals. Again, the sintered bond layer may or may not contain organic materials. In one embodiment, the sintered bond layer consist essentially of one or more metals (e.g., essentially pure Cu or essentially pure Ag) and are essentially free of organic material; that is, contain less than 1 wt % of organic materials. In other embodiments, the sintered bond layer may contain resin or other organic fillers. For example, in another implementation, the sintered bond layer may contain organic materials that increase pliability, such as an epoxy, to reduce the likelihood of crack formation and propagation across thermal cycles. Depending upon the desired final composition of the sintered bond layer, the parameters of the sintering process may be controlled to decompose organic materials from metal particle-containing precursor layer 52', in whole or in part. Additionally, the sintered bond layer may be produced to have a desired porosity, which may range from 0% to 30% by volume in an embodiment. In another embodiment, the sintered bond layer may be formed to each have a porosity of less than 1% by volume. Finally, the thickness of the sintered bond layers will vary amongst embodiments, but may range between about 5 µm and about 100 µm and, preferably, between about 15 µm and about 35 µm in one exemplary and non-limiting embodiment. In another embodiment wherein the sintered bond layers are composed of essentially pure Ag or Cu, the sintered bond layer may have a thickness range from about 40 µm to about 100 µm.

Following device attachment, appropriate electrical interconnections are next formed between the installed microelectronic device(s) and the terminals exposed from within the package interior. In the case of exemplary package 20', specifically, ball bonding or another wirebonding process is conveniently performed to form wirebonds 56 electrically coupling bond pads 54 of microelectronic device 30 to the exposed upper surfaces or "wirebond shelves" of proximal end portions 40 of package leads 24, as shown in FIG. 1. In other embodiments, a different interconnection technique can be employed. Similar inter-device connections may also be formed in embodiments in which ACM package 20 (FIGS. 1-2) contains multiple microelectronic devices, which are interconnected form an SiP. Electrical testing may further be performed, if desired, following device attachment and prior to the below-described cover piece attachment operation.

To complete partially-fabricated ACM package 20' (FIG. 11) and yield the completed version of package 20 shown in FIGS. 1-2, cover piece 22 is attached to upper peripheral edge portion 38 of molded package body 26. In certain instances, a low temperature sintering process can be utilized to join cover piece 22 to molded package body 26; noting that, in such embodiments, the foregoing description pertaining to device bond layer 52 is equally applicable to cover bond layer 46 shown in FIGS. 1-2. Alternatively, a flowable adhesive material, such as a high temperature epoxy or other die attachment material, may be utilized to bond cover piece 22 to molded package body 26. Bond layer 46, upper peripheral edge portion 38 of molded package body 26, and lower peripheral edge 44 of cover piece 22 cooperate to sealingly enclose air cavity 30 after device installation and electrical interconnection. Finally, if not yet performed, leadframe 62 can be singulated or trimmed to complete ACM package fabrication. As indicated above, embodiments of ACM package 20 are advantageously produced to an "optimized" body-cover interface having certain features, which aid the cover piece attachment process and help to ensure the reliable formation of a continuous, high integrity bond joint or seal at the interface between upper peripheral edge portion 38 of molded package body 26 and lower peripheral edge 44 of cover piece 22. Additional description of an exemplary cover piece attachment process and certain features that may facilitate cover piece attachment will now be described in conjunction with FIGS. 12-13.

Examples of Features Enhancing Bond Performance at the Cover-Body Juncture

Figure 12:
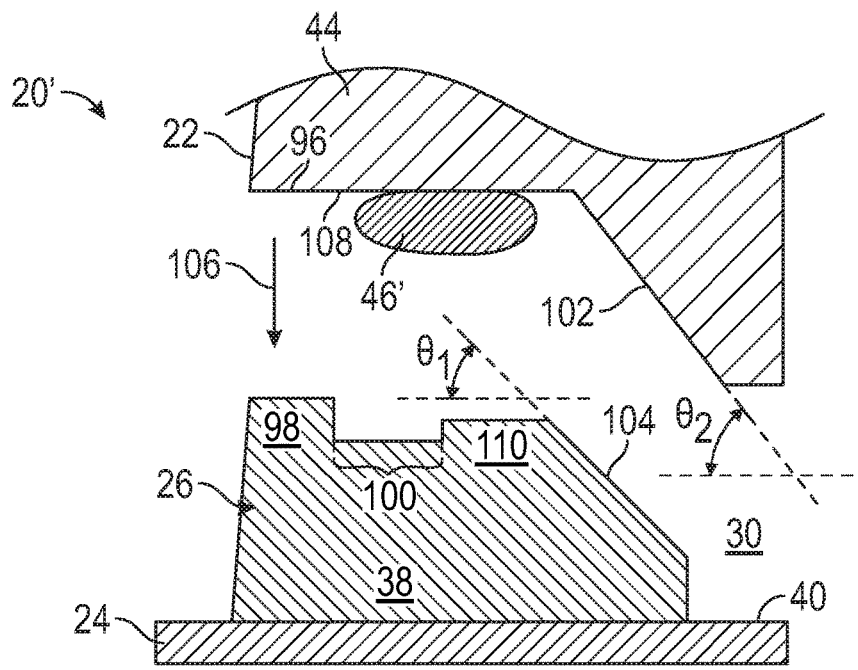
FIGS. 12 and 13 are cross-sectional schematics of an exemplary cover-body interface usefully included in ACM package shown in FIGS. 1-11, as illustrated prior to and after cover piece attachment, respectively.
Figure 13:
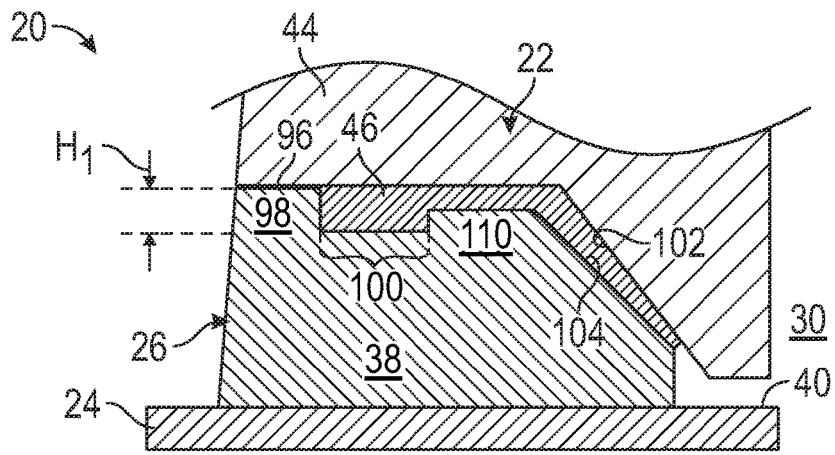

FIGS. 12 and 13 are cross-sectional schematics of an exemplary cover-body interface usefully included in ACM package 20 shown in FIGS. 1-11, as illustrated prior to and after cover piece attachment 22, respectively. As indicated above, the term "cover-body interface" refers to the physical features formed at and adjacent the juncture between lower peripheral edge 44 of cover piece 22 and upper peripheral edge portion 38 of molded package body 26. In the illustrated example, this cover-body interface is optimized through the inclusion of certain unique physical features. Such features may guide precision alignment of cover piece 22 relative to the remainder of package 20 during cover piece attachment; help promote the reliable formation of a high integrity, peripherally-continuous, low leakage bond at the cover-body juncture; and/or provide other desirable benefits. In the exemplary embodiment shown in FIGS. 12-13, specifically, the illustrated cover-body interface includes three principal types of features: (i) hardstop features 96, 98; (ii) an annular channel, void, or groove 100; and (iii) a number of angled contact surfaces 102, 104. Each of these feature are described below, in turn, with the understanding that such features can vary in type, number, and disposition in alternative embodiments of ACM package 20. For example, while certain features, such as annular channel 100, are shown as predominately or exclusively formed in upper peripheral edge portion 38 of molded package body 26 in the illustrated embodiment, such features can be predominately or exclusively formed in lower peripheral edge 44 of cover piece 22 in further embodiments.

Addressing first hardstop features 96, 98, hardstop feature 96 is formed on an outer flat region 108 of lower peripheral edge 44 of cover piece 22; the term "flat," as appearing herein, referring to a region having a substantially planar topology and extending principally in a plane orthogonal to package centerline 35 (FIG. 1). Comparatively, hardstop feature 98 is formed in an outer peripheral portion of upper peripheral edge portion 38 of molded package body 26. In this example, hardstop feature 98 assumes the form of a raised lip or rim, which projects upwardly from the bulk of upper peripheral edge portion 38 and bounds an outer peripheral portion of annular channel 100. As indicated in FIG. 12 by arrow 106, hardstop features 96, 98 are brought into physical contact when cover piece 22 is properly positioned or seated over molded package body 26. Hardstop features 96, 98 thus cooperate to precisely set or determine the vertical spatial relationship between cover piece 22 and molded package body 26, as taken package centerline 35 (FIG. 1). Relatedly, hardstop feature 98 sets the vertical height of annular channel 100 when enclosed or covered by flat region 108 of cover piece 22; identified in FIG. 13 by arrows $H_1$, as measured from the bottom of annular channel 100 to the uppermost surface of upper peripheral edge portion 38. In one embodiment, $H_1$ may range between about 25 μm and about 250 μm, as taken along package centerline 35. In other implementations, $H_1$ may be greater than or less than the aforementioned range.

With continued reference to FIGS. 12-13, annular channel 100 extends fully around upper peripheral edge portion 38 of molded package body 26. When cover piece 22 is positioned over package body 26 and, specifically, when hardstop features 96, 98 are brought into intimate physical contact or abutment, annular channel 100 is enclosed by flat region 108 of cover piece 22 and defines a volume of space or a void having a fixed, predetermined volumetric capacity. Annular channel 100 is desirably filled, in its entirety or its substantial entirety, with a bonding material during cover piece attachment. Accordingly, a controlled volume of bonding material may be dispensed or otherwise applied onto flat region 108 of cover piece 22 (shown), over annular channel 100, or a combination thereof; the bonding material identified in FIG. 12 by reference numeral "46'" as the bonding material is not yet transformed into its final shape and may still require curing, in some implementations, to yield finalized cover bond layer 46 shown in FIG. 13.

As the volumetric capacity of annular channel 100 is known, bonding material 46' can be provided in a volume that substantially matches or slightly exceeds the capacity. In this regard, in one implementation, bonding material 46' may be dispensed or otherwise applied in a predetermined volume exceeding the volumetric capacity of annular channel 100, while being less than the cumulative void or cavity space between lower peripheral edge 44 of cover piece 22 and upper peripheral edge portion 38 of molded body 26 (equivalent to the cross-sectional area defined or bounded by features 96, 98, 100, 102, 104, 110, as extended in three dimensional space around the entire periphery of ACM package 20). In another embodiment in which annular channel 100 has a volumetric capacity of $V_C$, while the bonding material is applied in a predetermined volume $V_{BM}$, the following equation may apply: $V_C < V_{BM} < 2V_C$. Complete filling of annular channel 100 can be therefore ensured during cover piece attachment to enable the consistent and reliable formation of a continuous, high integrity 360° seal around the periphery of air cavity 30. Additionally, as shown in FIG. 13, a step feature 110 may also be provided adjacent annular channel 100 opposite hardstop feature 98 to bound an inner peripheral portion of channel 100, while having a height less than that of feature 98 to provide an overflow area in fluid communication with channel 100 to accommodate excess bonding material outflow. Thus, step feature 110 and possibly contact walls 102, 104 may form a bonding material overflow reservoir, in a general sense; and, thus, may be contacted by the bonding material or cover bond layer 46 in the completed version of ACM package 20, as generally shown in FIG. 13. Comparatively, hardstop feature 98 may serve as a damn or blockade feature, which prevents undesired outflow of the bonding material from the package interior and which is likewise contacted by cover bond layer 46 in the completed package.

In addition to or in lieu of the features described above, the cover-body interface may also be usefully imparted with one or more angled contact surfaces, which help pilot or guide cover piece 22 into proper position over molded package body 26. Two such angled contact surfaces 102, 104 are shown in the example of FIGS. 12-13. As can be seen, angled contact surface 102 is formed on an inner peripheral portion of lower peripheral edge 44 of cover piece 22, while angled contact surface 104 is formed on upper peripheral edge portion 38 of molded package body 26. Angled contact surfaces 102, 104 may or may not extend fully around the periphery of ACM package, as taken about package centerline 35 (FIG. 1). Contact surfaces 102, 104 are "angled" in the sense that surfaces 102, 104 do not extend principally within horizontal planes orthogonal to package centerline 35. Instead, as labeled in FIG. 12, angled contact surfaces 102 forms a first acute angle $\theta_1$ with a horizontal plane or flange frontside 42, as measured in a clockwise direction; while angled contact surfaces 102 forms a second acute angle $\theta_2$ with a horizontal plane or flange frontside 42, as measured in the clockwise direction. Angles $\theta_1$, $\theta_2$ are tailored to guide cover piece 22 toward its properly centered over molded package body 26 as varying regions of surfaces 102, 104 come into contact during the cover attachment process. The values of angles $\theta_1$, $\theta_2$ will vary amongst embodiments; however, in certain embodiments, and as indicated in FIG. 12, $\theta_2$ may exceed $\theta_1$ such that angled contact surface 104 of cover piece 22 is closer to perpendicular with respect to flange frontside 42 (FIGS. 1, 2, 6, 9, and 11) than is angled contact surface 102 of molded package body 26. Angled contact surfaces 102, 104 are usefully located inboard of (that is, closer to the package centerline than are) hard stop features 96, 98 and annular channel 100, although this need not be the case in all implementations. Through the provision of such features, proper cover piece positioning and the formation of a high integrity bond between cover piece 22 and molded package body 26 can be consistently ensured across repeated iterations of the ACM package fabrication process. This is highly desirable.

CONCLUSION

There has thus been provided ACM packages and methods for producing ACM packages that can be carried-out in a relatively efficient, consistent, and cost-effective manner. Generally, such manufacturing processes may involve the formation of molded package bodies around leadframes and base flanges, which are staked or otherwise mechanically joined prior to the molding process to provide precision alignment between the leadframe leads and the base flanges. In certain embodiments, the molded package bodies may be formed to encompass or envelop the locating features of the base flanges (e.g., the above-described retention or staking posts), as well as corresponding locating features of the leadframes (e.g., retention tabs having openings through which the retentions posts are received). Additionally, each molded package body may be formed to include an open cavity through which a device mount area of the base flange is exposed. At least one microelectronic device is subsequently attached to the device mount area of the base flange, appropriate interconnections are formed (e.g., by wirebonding), and a lid or cover piece is bonded to the upper rim or edge of the molded package body to sealingly enclose the air cavity and complete fabrication of the ACM packages. Device attachment is usefully performed utilizing a low temperature sintering process to create a robust, metallurgical bond at the device-flange interface and to reduce undesired heat exposure of the molded package body.

In certain embodiments, the ACM package may further contain an optimized cover-body interface formed between the lower peripheral edge of cover piece and the upper peripheral edge or rim of the molded package body on which the cover piece seats. The optimized cover-body interface may include physical features guiding precision alignment of the cover piece during cover piece attachment and/or which help promote the reliable formation of a high integrity, peripherally-continuous, low leakage bond at the cover piece-package body juncture. By way of example, such physical features can include: a fixed-volume bonding material reservoir, which can be filled with a corresponding volume of epoxy or another bonding material; raised hardstop features, which set the vertical height of the bonding material reservoir when the cover piece is properly positioned over the molded package body; and/or angled contact surfaces, which physically guide the cover piece into the desired horizontally-centered position over the molded package body. In further embodiments, of the ACM package the cover-body interface may include only a subset of the aforementioned features, may include different features enhancing cover piece bonding, or may be formed to lack such features altogether.

In various embodiments, the above-described molded air cavity package includes a base flange, a molded package body bonded to the base flange, and package leads extending from the molded package body. The base flange includes, in turn, (i) a flange frontside having a device mount area; and (ii) a flange backside opposite the flange frontside, as taken along a centerline of the molded air cavity package. Retention posts are integrally formed with the base flange and extend from the flange frontside in a direction opposite the flange backside. The retention tabs have openings or apertures through which the retention posts are received. The molded package body may further be formed to envelope the retention posts and the retention tabs, in whole or in part. The package leads and the retention tabs may comprise, for example, singulated portions of a leadframe. Further, in implementation in which the retention posts extend substantially parallel to the centerline of the air cavity package, the retentions posts comprise deformed terminal ends preventing disengagement of the retention posts from the retention tabs along the package centerline in a direction opposite the base flange. In such implementations, the deformed terminal ends may assume the form of circumferentially-expanded staked heads of the retention posts.

In further embodiments, the molded air cavity package includes a molded package body having an upper peripheral edge portion, an air cavity around which the upper peripheral edge portion extends, and a cover piece bonded to the upper peripheral edge portion to sealingly enclose the air cavity. The cover piece has a lower peripheral edge portion, which cooperates with the upper peripheral edge portion to define a cover-body interface. The cover-body interface includes an annular channel extending around the cover-body interface, as taken about the package centerline. The cover-body interface also includes first and second hardstop features formed on the upper peripheral edge portion of the molded package body and on the lower peripheral edge portion of the cover piece, respectively. The first and second hardstop features contact or physically abut to determine a vertical height of the annular channel, as taken along the package centerline. In certain cases, the first hardstop feature assumes the form of a raised annular rim or lip, which extends around the upper peripheral edge portion of the molded package body and possibly bounds an outer perimeter of the annular channel. Additionally or alternatively, the molded air cavity package may further contain an annular step feature formed adjacent the annular channel and having a height less than that of the raised annular rim, as taken along the package centerline. Bonding material, which attaches the cover piece to the molded package body, may contact the annular step feature. Finally, in some cases, a knurled surface region may be provided on the flange frontside and may at least partially underlie the annular channel, as taken along the package centerline moving from the cover piece toward the flange backside (as illustrated in the example of FIGS. 1-13), In further embodiments, a method for producing the molded air cavity package, includes the step or processes of obtaining a base flange having a flange frontside from which a plurality of locating features extends, positioning the base flange with respect to a leadframe such that the plurality of locating features are received through openings in the leadframe and aligning the base flange to the leadframe, and deforming the plurality of locating features to mechanically capture the base flange against the leadframe. A molded package body is formed around selected regions of the base flange and the leadframe. In certain embodiments, the method may further include the steps of: (i) selecting the leadframe to comprise a plurality of leads, retention tabs through which the openings are provided, and dam bars connecting the retention tabs to the plurality of leads; and (ii) severing the dam bars after forming the molded package body around selected regions of the base flange and the leadframe. Additionally or alternatively, in an implementation in which the plurality of locating features assume the form of staking posts, the step of deforming may entail the usage of a staking tool to circumferentially-expand head portions of the staking posts after insertion through the openings in the leadframe.

In yet further embodiments, the method for producing a molded air cavity package may include positioning a microelectronic device in an air cavity defined, at least in part, by a base flange and a molded package body, the molded package body enveloping retention posts integrally formed with the base flange. After positioning the microelectronic device in the air cavity, the microelectronic device may be electrically interconnected (e.g., by wirebonding) with package leads bonded to the molded package body. After electrically interconnecting the microelectronic device, a cover piece may be bonded over the molded package body to sealingly enclose the air cavity. In certain implementations, the method may also include the steps or processes of applying a metal particle-containing precursor material at an interface between the microelectronic device and the base flange, and sintering the metal particle-containing sinter precursor material to produce a sinter bond layer bonding the microelectronic device to the base flange.

Finally, in a still further embodiments, the method for producing a molded air cavity package includes placing a base flange in a desired spatial relationship with respect to package leads contained in a leadframe. A molded package body is formed around selected regions of the base flange and the leadframe. The molded package body is formed to include an upper peripheral edge portion contacting the package leads and peripherally bounding an air cavity. The method further includes the step or process of, when forming the molded package body, imparting the upper peripheral edge with an annular channel extending around the air cavity, as taken about a centerline of the air cavity package. In certain cases in which the annular channel has a fixed volumetric capacity, as measured when a cover piece is positioned over and contacts a hardstop feature provided on the upper peripheral edge portion of the molded package body, the method may further include the step or process of attaching the cover piece to the molded package body utilizing a bonding material applied at an interface between the upper peripheral edge portion of the molded package body and a lower peripheral edge portion of the cover piece. The bonding material is advantageously applied in a predetermined volume exceeding the fixed volumetric capacity, while being less than a cumulative void space between the lower peripheral edge portion of the cover piece and the upper peripheral edge portion of the molded package body.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A molded air cavity package, comprising:
   a base flange, comprising:
      a flange frontside having a device mount area; and
      a flange backside opposite the flange frontside, as taken along a centerline of the molded air cavity package;
   retention posts integrally formed with the base flange and extending from the flange frontside in a direction opposite the flange backside;
   retention tabs having openings through which the retention posts are received;
   a molded package body bonded to the base flange and enveloping, at least in substantial part, the retention posts and the retention tabs; and
   package leads extending from the molded package body.

2. The molded air cavity package of claim 1 wherein the package leads and the retention tabs comprise singulated portions of a leadframe.

3. The molded air cavity package of claim 1 wherein the retention posts extend substantially parallel to the centerline of the air cavity package; and
   wherein the retentions posts comprise deformed terminal ends preventing disengagement of the retention posts from the retention tabs along the package centerline in a direction opposite the base flange.

4. The molded air cavity package of claim 3 wherein the deformed terminal ends comprise circumferentially-expanded staked heads of the retention posts.

5. The molded air cavity package of claim 1 wherein the retention tabs comprise singulated surfaces visible from an exterior of the molded package body.

6. The molded air cavity package of claim 1 further comprising punched depressions formed in the flange backside opposite the retention posts, as taken along the centerline of the molded air cavity package.

7. The molded air cavity package of claim 1 wherein the base flange further comprises a texturized surface region covered by and bonded to the molded package body.

8. The molded air cavity package of claim 7 wherein the texturized surface region is located adjacent junctures formed between the retention posts and the flange frontside.

9. The molded air cavity package of claim 1 further comprising:
   a microelectronic device contained in the air cavity package and electrically interconnected with the package leads; and
   a sintered metallic bond layer attaching the microelectronic device to the device mount area of the base flange.

10. The molded air cavity package of claim 9 wherein the sintered metallic bond layer is predominately composed of at least one of the group consisting of silver, gold, and copper, by weight.

11. The molded air cavity package of claim 1 wherein the package leads comprise proximal end portions bonded to the molded package body; and
   wherein the molded package body comprises at least one lead isolation shelf located between the flange frontside and the proximal end portions of the plurality of leads, as taken along the centerline of the molded air cavity package.

12. The molded air cavity package of claim 11 wherein the molded package body further comprises an upper peripheral edge portion integrally formed with the lead insolation shelf, contacting the package leads, and bounding an outer periphery of an air cavity provided in the molded package body.

13. The molded air cavity package of claim 1 further comprising:
- an air cavity;
- a microelectronic device located in the air cavity, bonded to the base flange, and electrically interconnected with the package leads; and
- a cover piece bonded to the molded package body to sealingly enclose the air cavity.

* * * * *